United States Patent
Kawaguchi

(10) Patent No.: US 6,847,538 B2
(45) Date of Patent: Jan. 25, 2005

(54) DOUBLE OPERATION SPEED IN DRAM WITH NEW MEMORY CELL CONFIGURATION

(75) Inventor: Kazuo Kawaguchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/377,869

(22) Filed: Mar. 4, 2003

(65) Prior Publication Data

US 2003/0198079 A1 Oct. 23, 2003

(30) Foreign Application Priority Data

Mar. 8, 2002 (JP) .......................... 2002-063022

(51) Int. Cl.⁷ .............................................. G11C 11/22
(52) U.S. Cl. ............................ 365/145; 365/63; 365/72
(58) Field of Search ............................. 365/145 O, 63, 365/72

(56) References Cited

U.S. PATENT DOCUMENTS 6,028,784 A * 2/2000 Mori et al. ................. 365/145

* cited by examiner

*Primary Examiner*—Van Thu Nguyen
(74) *Attorney, Agent, or Firm*—Oliff & Berridge, PLC

(57) ABSTRACT

Information processing speed is increased to about two times the speed in the related art. Even defects are partially included, memory cells other than the defective ones effectively used such that memory ICs with an enhanced yield are provided. A memory IC having bit lines through which data can be written and read at pairs of memory cells, is equipped with a pair of N-type MOS transistor N-Tr1 and P-type MOS transistor P-Tr2 that have gates commonly connected to each identical one of the word lines, and either sources thereof or drains thereof commonly connected to each identical one of the bit lines, capacitors that have electrodes on one side thereof respectively connected to the sources or the drains of the transistors that are not connected to the bit line BL and electrodes on the other side thereof commonly connected to a plate electrode of the memory IC, and an operation circuit that freely, selectively writes and reads data in and from either one of the one pair of the memory cells.

2 Claims, 4 Drawing Sheets

DOUBLE OPERATION SPEED IN DRAM WITH NEW MEMORY CELL CONFIGURATION

BACKGROUND OF THE INVENTION

1. Field of Invention

The present invention relates to memory ICs having bit lines to record and reproduce data in memory cells, such as ROMs, RAMs and the like.

2. Description of Related Art

FIGS. 4(a) and 4(b) show a related art memory IC. FIG. 4(a) shows a circuit diagram of a memory cell 40 that is a main part of the memory IC, and FIG. 4(b) shows a timing chart of operations of the memory cell 40. In FIG. 4(a), an N-type MOS transistor (hereafter "N-Tr") 4 has a drain D connected to a bit line BL, a gate G to a word line WL, and a source S to an electrode on one side of a capacitor C4.

The other electrode of the capacitor C4 is connected to a plate electrode P. A potential difference is present between the plate electrode P and the bit line BL, and the drain D and source S of the N-Tr4 and the capacitor C4 are serially interposed between the two. By a control signal on the word line WL, the N-Tr 4 functions as a timing switch, and a charge representing Hi-Low data (hereafter "Data") present on the bit line BL is charged or discharged to thereby compose the memory cell 40 that reads and writes data.

The memory cell 40 writes or reads Data4 indicated in FIG. 4(b) at timings in which the transistor therein shifts from OFF state to ON state. The N-Tr4 has its gate G connected to the word line WL, so that by switching the potential on the word line WL between Hi and Low, the N-Tr4 can be ON-OFF controlled at appropriate timings.

Referring to FIGS. 4(a) and (b), when a word signal that is formed with a pulse waveform rises from Low to Hi, the N-Tr4 turns ON as its gate G is set to Hi, and an electric charge is charged in the capacitor C4, such that Data4 is recorded in the memory cell 40. When the word signal falls from Hi to Low, no information processing takes place. Then, when the word signal that has once fell to Low rises again to Hi, the N-Tr4 turns ON, such that Data4 is outputted as a bit (out) signal to the word line WL.

Data4 may be written or read while intermittingly giving ON times at substantial intervals to the N-type transistor N-Tr4 indicated here as an example. In this manner, information is processed at timings when each one of pulses of the word signal rises from Low to Hi. In this case, a half of the operation contains information blank time, compared to a case in which information is continuously processed at both timings when each of the pulses of the word signal rises from Low to Hi and falls from Hi to Low, and therefore the operation is not continuous and instead is rather intermittent.

The speed of writing Data4 in the memory cell 40 is determined by a cycle time Tc. The cycle time means a shortest time starting from a moment when an address is given to a memory to read or write until a moment when an address for the next reading or writing can be given. Therefore, the higher the operation frequency of the memory IC and the shorter the cycle time Tc, the more precisely and the greater amount information can be processed to read and write.

SUMMARY OF THE INVENTION

The memory IC includes the memory cell 40 that is composed of the capacitor C4 that charges and discharges an electric charge representative of Data4, and the N-Tr that is interposed between the capacitor C4 and the bit line BL and has a function as a timing switch. Data4 is written in or read from the memory cell 40 at timings when the N-Tr shifts from OFF to ON.

There are two types of logic polarities, i.e., N-type and P-type that determine the condition in which the N-Tr is turned ON. In the case of an N-type MOS transistor in which the N-Tr operates with a first logic polarity, it turns ON when the voltage of the gate G rises to Hi. However, in the case of a P-type MOS transistor that operates with a second logic polarity, it turns ON when the potential of the gate G falls to Low. Therefore, to write or read Data4 in or from the memory cell 40, the voltage at the gate G needs to be appropriately controlled according to the N-type logic polarity or the P-type logic polarity that determines the condition to turn on the N-Tr4 so that it can shift from OFF to ON. FIGS. 4(a) and 4(b) show an N-type transistor N-Tr4 as an example for explanation.

Because the gate G is connected to the word line WL, only at one of a first timing at which the control voltage on the word line is switched from Low to Hi and a second timing at which the control voltage on the word line is switched from Hi to Low, the condition to turn on one of the N-type transistor and the P-type transistor that is actually connected to the word line WL is met, and Data is written in or read from the memory cell.

However, the first timings at which the control voltage on the word line WL is switched from Low to Hi and the second timings at which the control voltage on the word line is switched from Hi to Low always alternately occur. Therefore, if counted in a specified period of time, the first timings and the second timings amount to generally the same number. If Data can be written and read at both of the first and second timings, information can be processed at twice the speed of the related art scheme.

In view of the above, a first task is to achieve a higher performance by doubling the information processing speed compared to the related art one through writing and reading data at both of the first and second timings, because the control voltage on the word line WL always alternates between Hi and Low.

Next, a second task is to enhance an overall yield by providing a circuit structure that, even if some defects occur in a process of manufacturing memory ICs, invalidates data that passes the defective sections and makes an effective use of sections only other than the defective sections.

The present invention addresses or solves the above and/or other problems, and achieves higher speeds in order to read and write information twice as much as those achieved by a related art memory IC in the same period of time, and provides memory ICs at low costs, which enhances an overall yield in a process of manufacturing the memory ICs.

To address or achieve the above, the present invention provides a memory IC including: word lines; bit lines that traverse the word lines; a first memory cell and a second memory cell provided at intersections between the word lines and the bit lines; and an operation circuit that writes and reads data at the plurality of the first memory cell and the second memory cell. The first memory cell is composed of a first capacitor and an N-type MOS transistor. The second memory cell is composed of a second capacitor and a P-type MOS transistor. A gate of the N-type MOS transistor and a gate of the P-type MOS transistor are commonly connected to each identical one of the word lines. Either sources of the N-type MOS transistor and the P-type MOS transistor thereof or drains of the N-type MOS transistor and the P-type MOS transistor thereof are commonly connected to each identical one of the bit lines. Electrodes on one side of the first and second capacitors are commonly connected to a plate electrode of the memory IC. Electrodes on the other side of first capacitor are connected to the sources or the drains of the N-type MOS transistor the N-type MOS transistor. The other side of second capacitor is connected to the sources or the drains of the P-type MOS transistor and the operation circuit is composed of a circuit structure that freely writes and reads data in and from either one or both of first memory cell and second memory cell.

As a result, the N-type MOS transistor turns ON when the voltage at its gate rises to Hi, and the P-type MOS transistor turns ON when the voltage at its gate falls to Low, such that the N-type MOS transistor and the P-type MOS transistor can be continuously, alternately controlled to turn ON and OFF.

By this structure, the memory IC in accordance with the present invention that combines the memory cell 10 and the memory cell 20 can read and write information twice as much as that of a memory IC in the same period of time, which is composed of memory cells 40 including only N-type MOS transistors N-Tr1 which function when the voltage at their gates G is Hi, or a memory IC that is composed of memory cells including only P-type MOS transistors (not shown) which function when the voltage at their gates G is Low.

Also, the present invention may be equipped with an operation circuit that uniformly invalidates data that passes a group of the N-type MOS transistors or a group of the P-type MOS transistor which includes a defect in a test result among the pairs of the first and second transistors, and makes an effective use of data that passes through the other group of the MOS transistors in good quality.

In general, in an IC manufacturing process to manufacture memory ICs, whenever a defect occurs in MOS transistors that are fabricated through the same manufacturing steps, other defects mostly occur in either P-type MOS transistors or N-type MOS transistors which are fabricated by the same steps and include the defect.

However, for example, even when a majority of P-type MOS transistors fabricated by the same manufacturing steps has defects, N-type MOS transistors that are fabricated through different manufacturing steps may have been finished in good quality. The manufacturing quality of these MOS transistors can be checked by a dedicated IC checker to specify defects.

Accordingly, upon examining manufactured memory ICs by an IC checker to specify partial defects, if defects are found in a group of P-type MOS transistors P-Tr2 within the same IC, and it is found that a group of N-type MOS transistors are all in good quality, the group of P-type MOS transistors P-Tr2 that have the defects are not used at all, and only the N-type MOS transistors that are all in good manufacturing quality within the same IC are effectively used.

With memory ICs having the related art structure, when products having defective manufacturing quality occur, these defective products cannot be repaired or used, and thus discarded. In contrast, in accordance with the present invention, mass-produced memory ICs can be sorted into different ranks according to predetermined quality test standards, and can be sold for different uses and at different prices. For example, by sorting them into three ranks, i.e., good quality products, lower quality products and defective products, the lower quality products, which are deemed in the past to have no value, may have added values that match with the lower quality products. As a result, the overall yield can be enhanced.

BRIEF DESCRIPTION OF THE DRAWINGS

FIG. 4(a) is a schematic circuit diagram in which one of the pair of memory cells shown in FIG. 1 is removed, and FIG. 4(b) is a schematic timing chart of operations of the memory cell 40 shown in FIG. 4(a).

DETAILED DESCRIPTION OF PREFERRED EMBODIMENTS

One exemplary embodiment of the present invention is described below with reference to the accompanying drawings.

Figure 1:
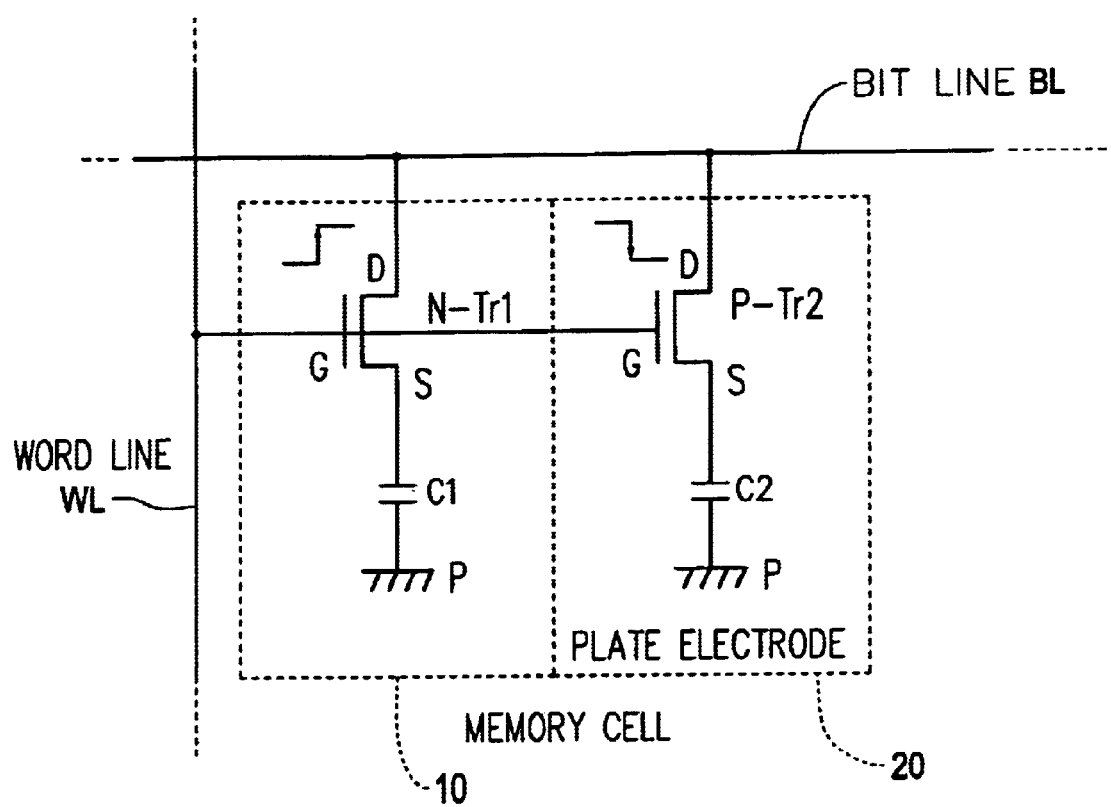
FIG. 1 is a schematic circuit diagram of significant parts of a memory cell in accordance with an exemplary embodiment of the present invention.

FIG. 1 is a schematic circuit diagram of significant parts of a memory cell in accordance with an exemplary embodiment of the present invention. A memory cell 10 is composed of an N-Tr1 having a drain D connected to a bit line BL, a gate G connected to a word line WL and a source S connected to an electrode of a capacitor C1 on one side thereof. Also, a memory cell 20 is composed of a P-Tr2 having a drain D connected to the bit line BL, a gate G connected to the word line WL and a source S connected to an electrode of a capacitor C2 on one side thereof. The memory cell 10 and the memory cell 20 are structured such that the N-Tr1 and the P-Tr2, which are significant parts, have their drains D connected to the common bit line BL and their gates G connected to the word line WL, and the other electrodes of the capacitors C1 and C2 that are connected to the sources S are connected to a common plate electrode P.

A predetermined potential difference is present between the plate electrode P and the bit line BL, and the drains D and sources S of the N-Tr1 and P-Tr2 and the capacitors C1 and C2 connected to the respective sources S are serially interposed between the two. By a control signal on the word line WL, the N-Tr1 and P-Tr2 function as timing switches, and a charge representing Data at Hi-Low present on the bit line BL is charged or discharged to thereby compose the memory cell 10 and memory cell 20 that read and write data.

The memory cells 10 and 20 write or read Data1 and Data2 described below with reference to FIG. 3 at timings in which the transistors therein shift from OFF state to ON state. The N-Tr1 and P-Tr2 have their respective gates G connected to the word line WL, such that by switching the potential on the word line WL between Hi and Low, the N-Tr1 and P-Tr2 can be ON-OFF controlled at appropriate timings. Write and read timings for Data are set with the N-Tr1 and P-Tr2 being used as switching elements. Data1 and Data2 are read and written through charging and discharging electric charges in the capacitors C1 and C2 connected to the sources S of the respective N-Tr1 and P-Tr2.

In this manner, in the memory IC (although the entire structure is not shown in the figure) that has the bit lines BL through which memory contents of the memory cells 10 and 20 that are disposed mutually adjacent to one another are commonly read out, each of the pairs of N-Tr1 and P-Tr2 has their drains D and gates S commonly connected to each other, the drains D are connected to the same bit line BL, the gates G are connected to the same word line WL, and the sources S are connected to the plate electrode P through the capacitors C1 and C2.

The N-Tr1 turns ON when the voltage at its gate G rises to Hi, and the P-Tr2 turns ON when the voltage at its gate G falls to Low. Therefore, with the memory cell 10 that is composed of the N-Tr1 and the C1 and the memory cell 20 that is composed of the P-Tr2 and the C2, when one of the transistors (hereinafter "Tr") having one logic polarity is turned ON and Data is written or read out, the other transistor having the other logic polarity is turned OFF such that Data cannot be written or read. In other words, the memory cell 10 and the memory cell 20 are in complementary relation. An operation circuit (not shown) is provided to freely, selectively read or write Data using one of the transistors Tr having a chosen logic polarity among the N-Tr1 and P-Tr2 that compose the memory cells 10 and 20. By this operation circuit, ON timings can be selectively given to the Tr having a chosen logic polarity to freely write and read Data.

As a result, the voltage on the word line WL may be alternated between Hi and Low, such that the voltage at the gates G of the P-type and N-type transistors connected to the word line WL are alternated between Hi and Low and thus the N-Tr1 and P-Tr2 can be controlled to alternately turn ON and OFF.

Accordingly, the memory cell 10 and the memory cell 20 in accordance with the present invention can read and write, in the same period of time, information twice as much as information provided by a structure only with a memory cell 10 including an N-Tr1 that functions only when the voltage at its gate G is Hi, or a structure only with a memory cell 20 including a P-Tr2 that functions when the voltage at its gate G is Low.

Figure 2:
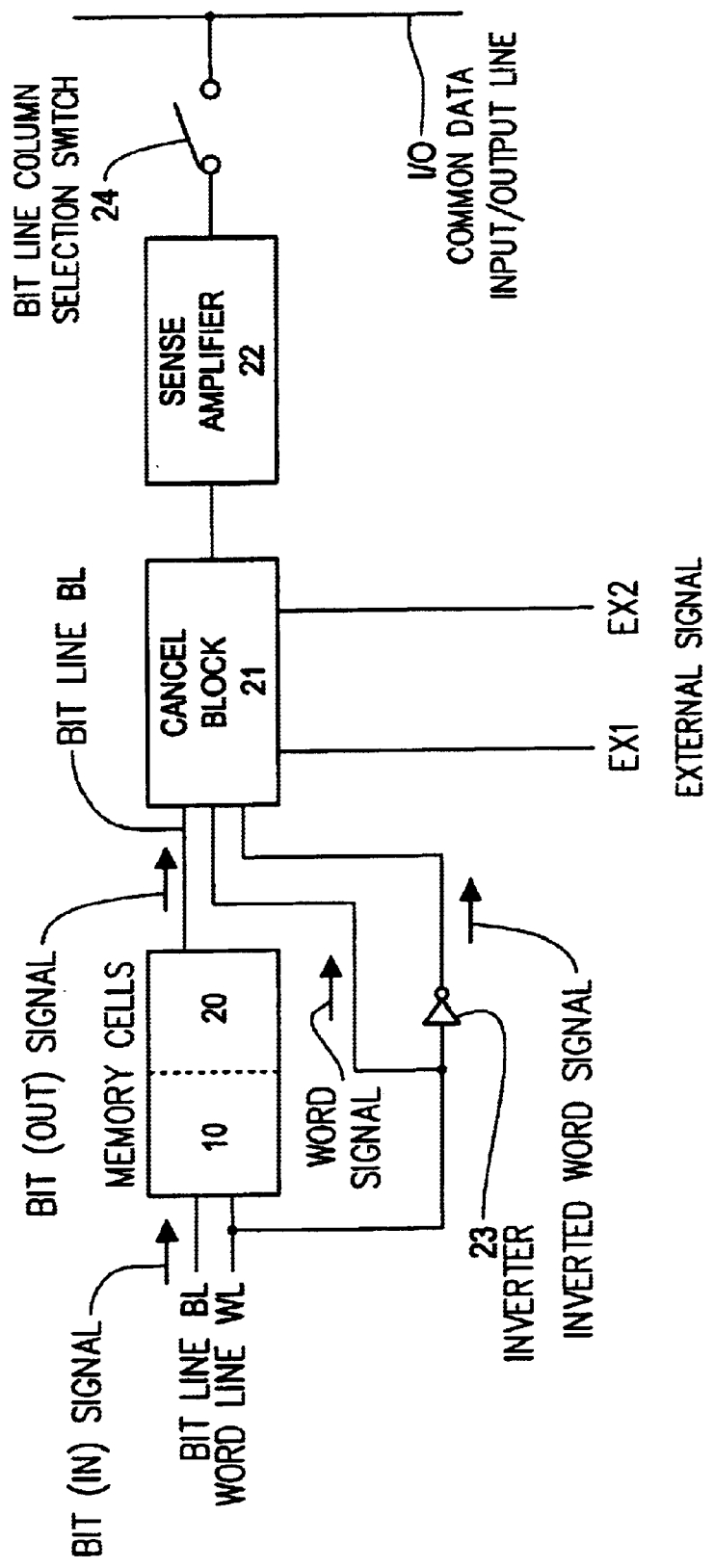
FIG. 2 is a schematic circuit diagram indicating an operation circuit that can invalidate one of the memory cells 10 and 20 shown in FIG. 1 and other circuits connected thereto.

FIG. 2 is a schematic circuit diagram indicating an operation circuit that has an effect to invalidate one of the memory cells 10 and 20 shown in FIG. 1 and other circuits connected thereto. In the circuit diagram, the memory cells 10 and 20 are connected to the word line WL and the bit line BL in a similar manner as they are connected in FIG. 1. The bit line BL inputs bit (in) signals in the memory cells 10 and 20 and outputs bit (out) signals. The bit line BL connects to a cancel block 21, which operates to cancel one of the bit (out) signals of the memory cell 10 and memory cell 20 which is optionally selected.

In addition to the bit signals inputted in the cancel block 21, a word signal on the word line WL as is, an inverted word signal that is obtained by inverting the word signal by an inverter 23, and external signals EX1 and EX2 are inputted to the cancel block 21. A sense amplifier 22 is connected to the cancel block 21 in its succeeding stage, to judge Hi or Lo, as is known or in accordance with later developed technology, and outputs from the sense amplifier 22 are connected to a bit line column selection switch 24 and a common data input-output line I/O. The cancel block 21 cancels Data1 when the external signal EX1 is inputted, and cancels Data2 when the external signal EX2 is inputted, as described below with reference to FIGS. 1–3.

Figure 3:
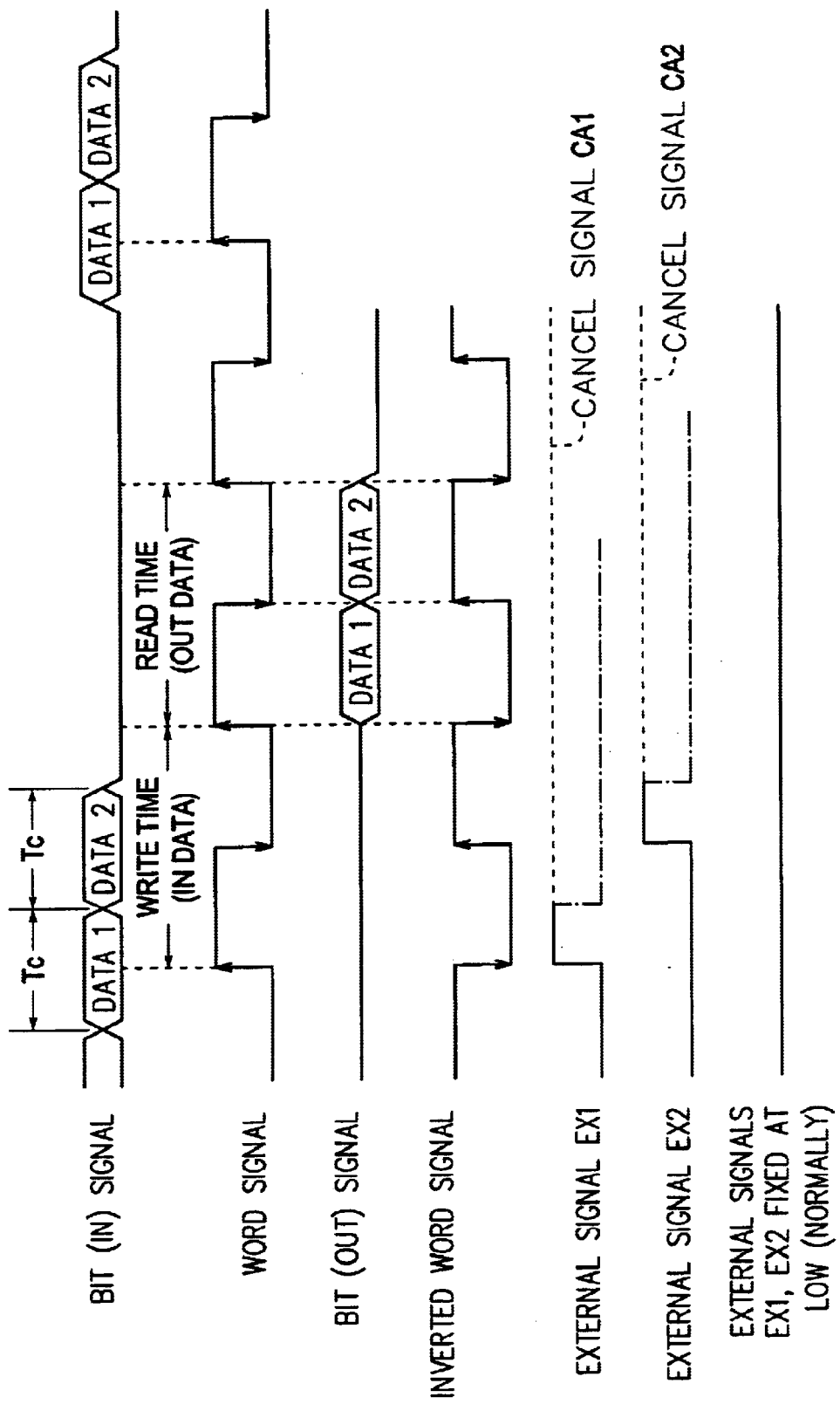
FIG. 3 is a timing chart of operations in which Data is written and read in and from the memory cells 10 and 20 shown in FIG. 1.

FIG. 3 is a schematic timing chart of operations in which Data is written and read in and from the memory cells 10 and 20 shown in FIG. 1. Data1 and Data2 representing digital Data exist at timings indicated in the bit (in) signal. When the word signal rises, Data1 is recorded in the memory cell 10, and when the word signal falls, Data2 is recorded in the memory cell 20.

In the memory cells 10 and 20 shown in FIG. 1, the N-Tr1 turns ON when the voltage of its gate G rises to Hi, and the P-Tr1 turns ON when the voltage at its gate G falls to Low. Therefore, with the memory cell 10 that is composed of the N-Tr1 and the C1 and the memory cell 20 that is composed of the P-Tr2 and the C2, when one of the transistors Tr is turned ON and Data is written or read, the other transistor Tr is turned OFF such that Data cannot be written or read. In other words, the memory cell 10 and the memory cell 20 are in complementary relation; and when the word signal rises, the memory cell 10 operates, and when the word signal falls, the memory cell 20 operates, such that Data can be written and read at both timings at which each one of the pulses of the word signal rises and falls. In this manner, Data is written and read through continuously giving ON timings to transistors Tr of P-type and N-type logic polarities.

Figure 4A:
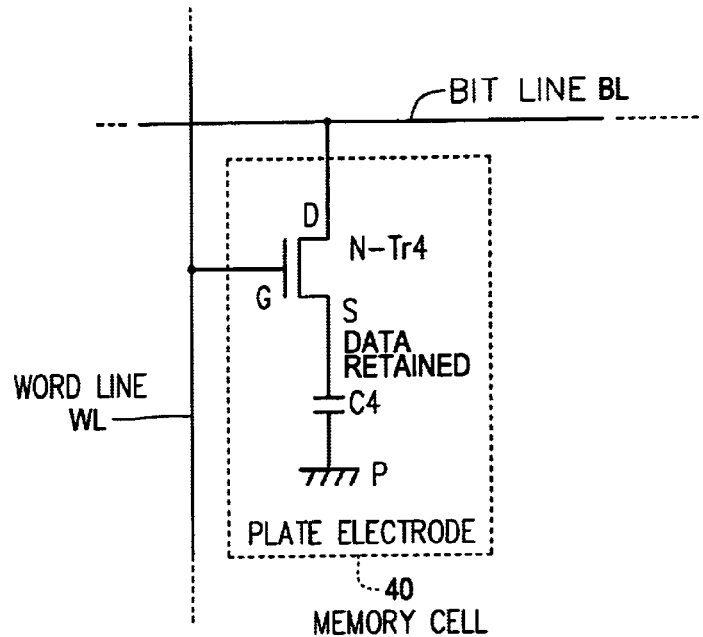
FIGS. 4(a) and 4(b) show related art examples for comparison with the circuit diagram of FIG. 1, where
Figure 4B:
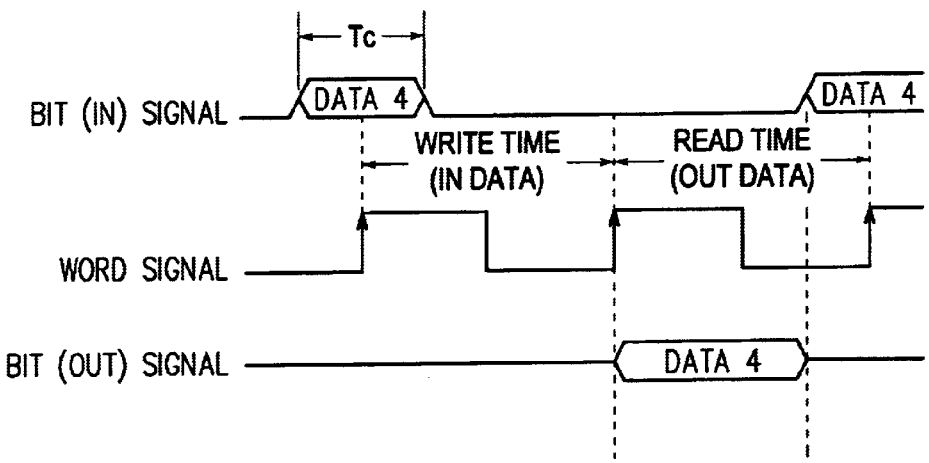

In the same cycle time Tc, the memory with finer operations shown in FIG. 3 can process information twice as much as information that is processed by the operation in which information blank periods occur half of the time, as shown in FIG. 4(b), and Data4 is intermittently written or read by the bit (out) signal shown in FIG. 4(b). In other words, the operation speed is doubled.

Operations in which Data1 is canceled when an external 1 signal is inputted and Data2 is canceled when an external 2 signal is inputted are described with reference to FIGS. 1–3. The reason for cancellation is because, when one of Data1 and Data2 is normal, and the other is abnormal, the normal one is maintained and the abnormal one is cancelled such that, even though the function of the memory cell IC is reduced in half, it can be provided as a lower quality product that makes use of only the normal one among the memory cell 10 and the memory cell 20. Judgment of abnormality can be conducted by a known checker through examining outputted Data or in accordance with later developed technology.

Referring to FIGS. 1–3, when Data1 is judged to be abnormal by the checker, the external signal EX1 of one pulse at Hi having a chosen length is inputted in the cancel block 21. Then, a cancel signal CA1, which is synchronized with rise timings of the word signal, is generated as indicated by a broken line. While the cancel signal CA1 is at Hi, Data1 is cancelled by an internal processing of the cancel block 21, so that a bit (out) signal is not outputted. In this manner, the memory cell 10 that outputs the abnormal Data can be controlled to not be used by inputting the external signal EX1 in the cancel block 21, which is practically equivalent to non-existing.

Referring to FIGS. 1–3, when Data2 is judged to be abnormal by the checker, the external signal EX2 of one pulse at Hi having a chosen length is inputted in the cancel block 21. Then, a cancel signal CA2, which is synchronized with rise timings of the inverted word signal, is generated as indicated by a broken line. While the cancel signal CA2 is at Hi, Data2 is cancelled by an internal processing of the cancel block 21, so that a bit (out) signal is not outputted. In this manner, the memory cell 20 that outputs the abnormal Data can be controlled to not be used by inputting the external signal EX2 in the cancel block 21.

In general, in an IC manufacturing process for manufacturing memory ICs, whenever a defect occurs in MOS transistors which are fabricated through the same steps, other defects mostly occur in either P-type MOS transistors or N-type MOS transistors which are fabricated by the same steps and include the defect. Moreover, such defects can be readily specified by examination with a known checker or in accordance with later developed technology.

Among the N-type MOS transistors N-Tr1 and the P-type MOS transistor P-Tr2 that compose the memory cells 10 and 20, one of the groups of MOS transistors in one polarity that include defects is not entirely used, and another group of MOS transistors in one logic polarity in generally good manufacturing quality within the same IC can be effectively used.

With memory ICs having the related art structure, when products having defective manufacturing quality occur, these defective products cannot be repaired or used, and thus discarded. In contrast, in memory ICs in accordance with the present invention, the defective products can be sorted into different ranks according to predetermined quality test standards, and can be sold for different uses and at different prices. For example, by sorting products into three ranks, i.e., good quality products, lower quality products and defective products, the lower quality products can have added values that match with the lower quality products. As a result, the overall yield can be enhanced.

In the present invention that is structured as described above, the N-type MOS transistor N-Tr1 and the P-type MOS transistor P-Tr2 can be continuously, alternately controlled to turn ON and OFF, such that the memory IC in accordance with the present invention can read and write information twice as much as that of a memory cell structure which is composed only of N-type MOS transistors that turn ON when the voltage at their gates G is Hi, or a memory cell structure which is composed only of P-type MOS transistors that turn ON when the voltage at their gates G is Low, in the same period of time.

With memory ICs having the conventional structure, when products having defective manufacturing quality occur, these defective products cannot be repaired or used, and thus discarded. In contrast, in accordance with the present invention, mass-produced memory ICs can be sorted into different ranks according to predetermined quality test standards, and can be sold for different uses and at different prices. For example, by sorting them into three ranks, i.e., good quality products, lower quality products and defective products, the lower quality products may have added values that match with the lower quality products. As a result, the overall yield can be enhanced.

What is claimed is:

1. A memory IC, comprising:

word lines;

bit lines that traverse the word lines;

a first memory cell and a second memory cell provided at intersections between the word lines and the bit lines, the first memory cell being composed of a first capacitor and an N-type MOS transistor, the second memory cell being composed of a second capacitor and a P-type MOS transistor, a gate of the N-type MOS transistor and a gate of the P-type MOS transistor being commonly connected to each identical one of the word lines, and either sources of the N-type MOS transistor and the P-type MOS transistor or drains of the N-type MOS transistor and the P-type MOS transistor being commonly connected to each identical one of the bit lines, electrodes on one side of the first and second capacitors being commonly connected to a plate electrode of the memory IC, and an electrode on the other side of the first capacitor being connected to the source or the drain, an electrode on the other side of second capacitor being connected to the source or the drain; and an operation circuit that writes and reads data at the plurality of the first memory cell and the second memory cell, the operation circuit being composed of a circuit structure that writes and reads data in and from either one or both of the first memory cell and the second memory cell.

2. The memory IC according to claim 1, further comprising an operation circuit that uniformly invalidates data that passes through a group of N-type MOS transistors or a group of P-type MOS transistors which includes a defect in a test result among one of the groups of N-type MOS transistors and P-type MOS transistors, and makes an effective use of data that passes through the other group of N-type MOS transistors and P-type MOS transistors in good quality.

* * * * *